United States Patent
Nelson et al.

(10) Patent No.: US 8,482,564 B2
(45) Date of Patent: Jul. 9, 2013

(54) REGION OVERLAP CONTROL FOR AUTORANGE/AUTOSET FUNCTIONS

(75) Inventors: Craig H. Nelson, Hillsboro, OR (US);
David Shanks, Hillsboro, OR (US);
Evan A. Dickinson, Portland, OR (US);
Leif X. Running, Portland, OR (US);
Steven C. Herring, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 981 days.

(21) Appl. No.: 11/930,776

(22) Filed: Oct. 31, 2007

(65) Prior Publication Data

US 2009/0109226 A1    Apr. 30, 2009

(51) Int. Cl.
*G06T 11/20*    (2006.01)
(52) U.S. Cl.
USPC ........... 345/440; 345/619; 345/629; 715/700; 715/790
(58) Field of Classification Search
USPC .................. 345/619, 440, 629, 400; 715/700, 715/790
See application file for complete search history.

(56) References Cited

U.S. PATENT DOCUMENTS

| | | | |
|---|---|---|---|
| 5,557,718 A * | 9/1996 | Tsuneyoshi et al. | 345/440 |
| 6,054,984 A * | 4/2000 | Alexander | 715/771 |
| 7,369,127 B1 * | 5/2008 | Hull | 345/440 |
| 2002/0008702 A1* | 1/2002 | Gilbert | 345/440.1 |
| 2002/0044407 A1* | 4/2002 | Stilley et al. | 361/679 |
| 2002/0080150 A1* | 6/2002 | Nakatani | 345/660 |
| 2003/0182333 A1* | 9/2003 | Good et al. | 708/131 |

FOREIGN PATENT DOCUMENTS

| | | | |
|---|---|---|---|
| JP | 05312837 A | * | 11/1993 |
| JP | 2005189066 A | * | 7/2005 |

OTHER PUBLICATIONS

"Easy Microsoft Office Excel 2003", 2004. part 6, p. 1-33.*

* cited by examiner

*Primary Examiner* — Michelle L Sams
(74) *Attorney, Agent, or Firm* — Francis I. Gray; Thomas F. Lenihan; Marger Johnson & McCollom, P.C.

(57) ABSTRACT

A method of region overlap control for the display of a plurality of waveforms on an instrument includes an overlap function that allows selection by a user of a vertical height on a display screen for each of the waveforms. A ground marker for each of the waveforms is adjusted on the display screen according to the selected vertical height. The result is that the plurality of waveforms are displayed on the display screen in an overlapping fashion with sufficient vertical height to enhance triggering, all measurement functions and secondary functions, such as harmonics and switching loss measurements.

14 Claims, 6 Drawing Sheets

| Number of Channels On | Channel: | Region of Waveform Containment in Divisions: | Maximum Divisions of Each Waveform | Ground Marker Reference Position in Divisions: |
|---|---|---|---|---|
| 1 | the one turned on | +4 to -4 | 8 | 0 |
| | | | | |
| 2 | Lowest numbered | +4 to 0 | 4 | +2 |
| 2 | Highest numbered | 0 to -4 | 4 | -2 |
| | | | | |
| 3 | Lowest numbered | +4 to +1 | 2 | +2 |
| 3 | Mid numbered | +1 to -1 | 2 | 0 |
| 3 | Highest numbered | -1 to -4 | 2 | -2 |
| | | | | |
| 4 | Ch 1 | +4 to +2 | 2 | +3 |
| 4 | Ch 2 | +2 to 0 | 2 | +1 |
| 4 | Ch 3 | 0 to -2 | 2 | -1 |
| 4 | Ch 4 | -2 to -4 | 2 | -3 |

| Number of Channels On | Channel: | Region of Waveform Containment in Divisions: | Maximum Divisions of Each Waveform | Ground Marker Reference Position in Divisions: |
|---|---|---|---|---|
| 1 | the one turned on | +4 to -4 | 8 | 0 |
|  |  |  |  |  |
| 2 | Lowest numbered | +4 to -4 | 8 | 0 |
| 2 | Highest numbered | +4 to -4 | 8 | 0 |
|  |  |  |  |  |
| 3 | Lowest numbered | +4 to -4 | 8 | 0 |
| 3 | Mid numbered | +4 to 0 | 4 | +2 |
| 3 | Highest numbered | 0 to -4 | 4 | -2 |
|  |  |  |  |  |
| 4 | Lowest numbered | +4 to -4 | 8 | 0 |
| 4 | Next Lowest | +4 to 0 | 4 | +2 |
| 4 | Next Highest | 0 to -4 | 4 | -2 |
| 4 | Highest numbered | 0 to -4 | 4 | -2 |
|  |  |  |  |  |
| 5 | Lowest numbered | +4 to -4 | 8 | 0 |
| 5 | Next Lowest | +4 to 0 | 4 | +2 |
| 5 | mid | +4 to 0 | 4 | +2 |
| 5 | Next Highest | 0 to -4 | 4 | -2 |
| 5 | Highest numbered | 0 to -4 | 4 | -2 |
|  |  |  |  |  |
| 6 | Lowest numbered | +4 to -4 | 8 | 0 |
| 6 | ... | +4 to -4 | 8 | 0 |
| 6 | ... | +4 to 0 | 4 | +2 |
| 6 | ... | +4 to 0 | 4 | +2 |
| 6 | ... | 0 to -4 | 4 | -2 |
| 6 | Highest numbered | 0 to -4 | 4 | -2 |

FIG.4

| Number of Channels On | Channel: | Region of Waveform Containment in Divisions: | Maximum Divisions of Each Waveform | Ground Marker Reference Position in Divisions: |
|---|---|---|---|---|
| 1 | the one turned on | +4 to -4 | 8 | 0 |
|  |  |  |  |  |
| 2 | Lowest numbered | +4 to -2 | 7 | +0.5 |
| 2 | Highest numbered | +2 to -4 | 7 | -0.5 |
|  |  |  |  |  |
| 3 | Lowest numbered | +4 to -2 | 6 | +1 |
| 3 | Mid numbered | +3 to -3 | 6 | 0 |
| 3 | Highest numbered | +1 to -4 | 6 | -1 |
|  |  |  |  |  |
| 4 | Lowest | +4 to -1 | 5 | +1.5 |
| 4 | Next Lowest | +3 to -2 | 5 | +0.5 |
| 4 | Next Highest | +2 to -3 | 5 | -0.5 |
| 4 | Highest | +1 to -4 | 5 | -1.5 |
|  |  |  |  |  |
| 5 | Lowest | +4 to 0 | 4 | +2 |
| 5 | Next Lowest | +3 to -1 | 4 | +1 |
| 5 | mid | +2 to -2 | 4 | 0 |
| 5 | Next Highest | +1 to -3 | 4 | -1 |
| 5 | Highest | 0 to -4 | 4 | -2 |
|  |  |  |  |  |
| 6 | Lowest | +4 to +1 | 3 | +2.5 |
| 6 | ... | +3 to 0 | 3 | +1.5 |
| 6 | ... | +2 to -1 | 3 | +0.5 |
| 6 | ... | +1 to -2 | 3 | -0.5 |
| 6 | ... | 0 to -3 | 3 | -1.5 |
| 6 | Highest | -1 to -4 | 3 | -2.5 |

REGION OVERLAP CONTROL FOR AUTORANGE/AUTOSET FUNCTIONS

FIELD OF THE INVENTION

The present invention relates to instrumentation setup, and more particularly to autorange/autoset functions for waveform display instruments.

BACKGROUND OF THE INVENTION

Figure 1:
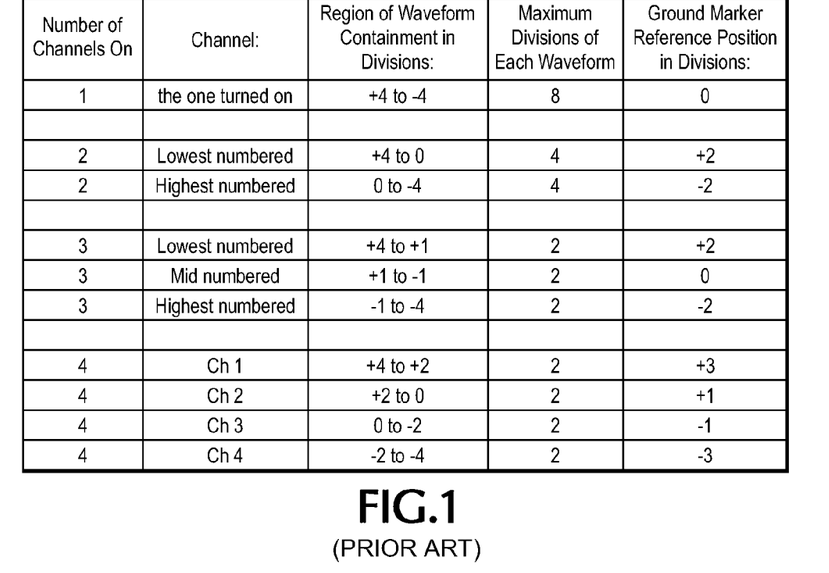
FIG. 1 is a Table defining specific regions within a screen display for multiple waveforms according to the prior art.
Figure 2:
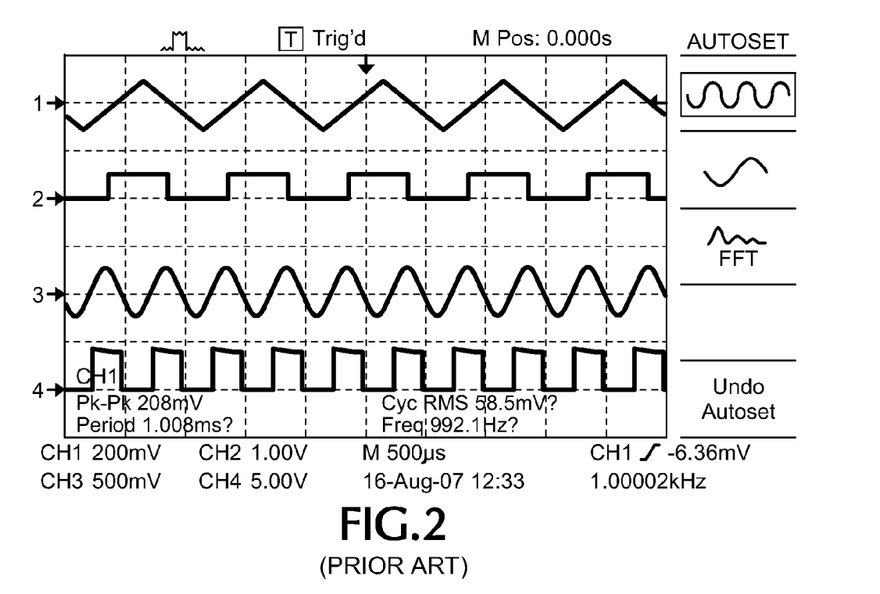
FIG. 2 is a plan view of a display screen view of multiple waveforms according to the prior art.

Test and measurement instruments which display multiple waveforms simultaneously, such as the TPS2000-Series Oscilloscopes manufactured by Tektronix, Inc. of Beaverton, Oreg., have Autorange and Autoset functions that assign specific waveforms to specific regions on a display screen. Generally there also is displayed some kind of graticule, such as one having eight (8) major vertical divisions. These major vertical divisions are defined where the extreme upper waveform display edge is at +4 divisions of the display screen, the center of the display screen is at 0 divisions and the extreme lower waveform display edge is at −4 divisions of the display screen. Current Autorange and Autoset functions assign waveforms to separate specific regions of the display screen as shown, for example, in the Table of FIG. 1. Ground reference markers also are assigned specific positions, as also shown in FIG. 1. FIG. 2 is a display screen showing four waveforms in separate specific regions conforming to the Table of FIG. 1.

The problem with this prior art scheme is that, as more waveforms are displayed within specific regions of the display screen, each waveform occupies less vertical display space. Not only does this make the waveforms more difficult for a user to see, but much of the resulting instrument functionality is based upon the waveforms having more than at least one or two major vertical divisions. Small vertical displays of waveforms hamper triggering, and adversely affect all measurement functions, and secondary functions such as harmonics and switching loss measurements.

Therefore what is desired is Autorange and Autoset functions that provide a larger vertical display of multiple waveforms in order to enhance viewing, triggering, measurement and secondary functions.

SUMMARY OF THE INVENTION

Accordingly, the present invention provides a region overlap control for multiple acquired waveforms displayed on an instrument screen. An overlap function provides to a user the ability to assign vertical heights for each of the waveforms and to adjust a ground marker for each waveform. The vertical heights may be automatically assigned based upon a selected overlap option for the overlap function. Also, the ground marker for each waveform may be adjusted manually or may be adjusted automatically as a function of the number of displayed waveforms. Therefore, the waveforms overlap to provide sufficient vertical height in order to enhance viewing, triggering, measurement and secondary functions.

The objects, advantages and other novel features of the present invention are apparent from the following detailed description when read in conjunction with the appended claims and attached drawing figures.

DETAILED DESCRIPTION OF THE DRAWING

In order to achieve a larger vertical display for multiple acquired waveforms on an instrument display screen, an overlapping waveform function is provided within Autorange and Autoset functions and during normal instrument operation. A user is given an option, generally within the Autorange and Autoset functions, which defines how the multiple waveforms are to be overlapped or displayed. This feature has the effect of giving the overlapping waveforms more vertical display space, which enhances triggering, all measurement functions, and secondary functions because these functions are enhanced with additional vertical resolution.

Generally, each waveform is acquired by a different acquisition channel of the instrument and stored temporarily in corresponding separate acquisition memories, or sections of a common acquisition memory. The waveforms are then rendered for display by mapping each waveform into a display memory, the mapping being a function of the scale of each waveform, that is, the appropriate mV per division for each channel, and the particular overlap option selected by the user. The display memory is periodically used to refresh the image shown on the display screen.

Figure 3A:
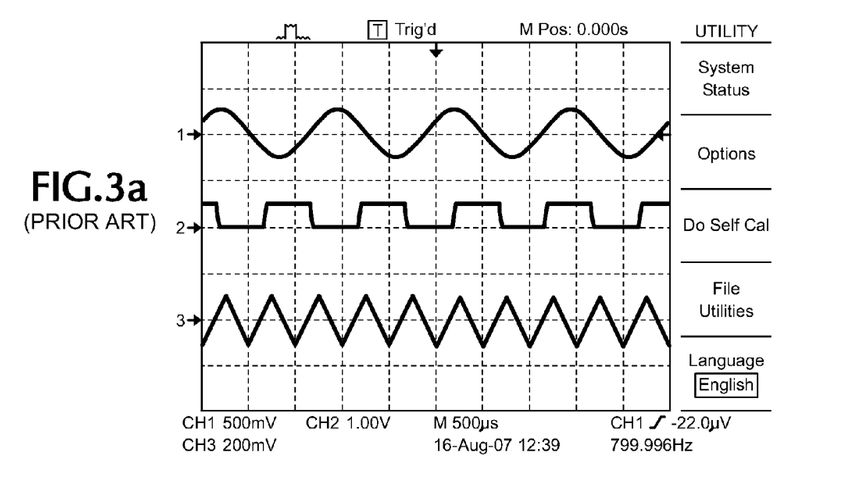
FIGS. 3a and 3b are plan views of display screens including an overlap option (FIG. 3b) for multiple waveforms according to an embodiment of the present invention.
Figure 3B:
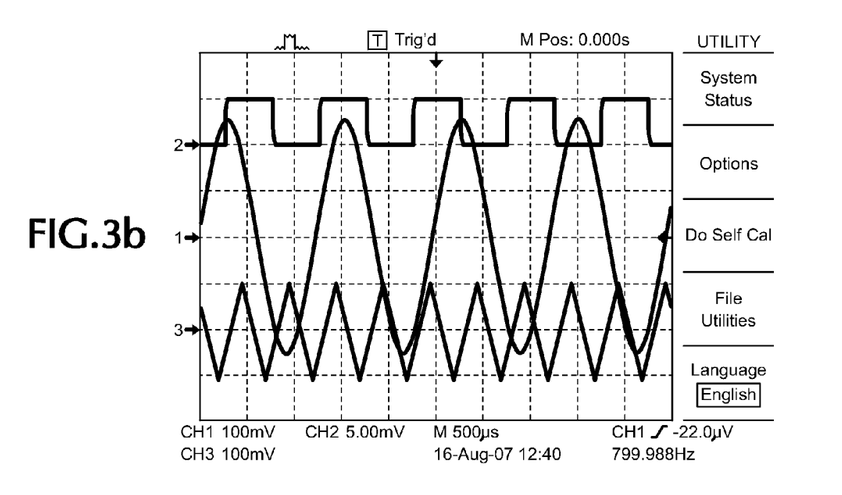

Referring now to FIG. 3a the waveforms from three separate acquisition channels are shown on a display, the waveforms having been Autoset for display without overlapping, as known from the prior art. FIG. 3b shows the same three waveforms being Autoset for display using overlapping regions according to the Table of FIG. 4, which is discussed below.

In normal instrument operation, exclusive of Autorange or Autoset functions, all displayed waveforms are instantly redisplayed according to the overlap selection. This amounts to a quick reformatting of the display screen irrespective of the content on the screen. If, for example, the user chooses an overlap where a particular waveform vertical size doubles and the current vertical scale is one volt per major division, then the new scale chosen becomes 500 millivolts per division.

In the example of FIG. 3b notice how more sensitive scaling is chosen for the displayed waveforms when overlapped. Channel 1 is changed from 500 mV per division in FIG. 3a to 100 mV per division. Channels 2 and 3 also show additional detail with more sensitive scaling.

One way of achieving the overlap option is to provide a new menu button that contains a number of "barrel" style selections based upon the number of visible waveforms. Such a menu button may take the form of a soft key displayed on a touch screen, such as those as displayed on the right side of the display screen in FIGS. 2, 3a, 3b, and 6. Different embodiments are described below.

A default choice for the overlap function may be "none", which yields non-Craig overlapping waveforms as in the prior art. A second choice may be "all", which causes all ground markers of the displayed waveforms to be centered at 0 divisions. The Autorange and Autoset functions then choose the scales for each waveform that maximize the waveform on the display screen, i.e., keeping all waveforms within the vertical limits of the entire display screen. For three or more waveforms there may be additional overlap selections, such as "overlap" and "mixed." The allowable choices may be limited to a humanly pleasing, utilitarian number of selections, such as "small overlap" and "large overlap."

When three waveforms are being displayed, the overlap choices may allow, for example:

waveform 1 uses the entire display screen, while waveforms 2 and 3 are allocated to the top and bottom screen halves respectively, as shown in FIG. 3*b*;

waveforms 1 and 2 share the top half of the screen while waveform 3 is allocated to the bottom half of the screen; and waveform 1 uses the top half of the screen, while waveforms 2 and 3 share the bottom half.

Figure 4:
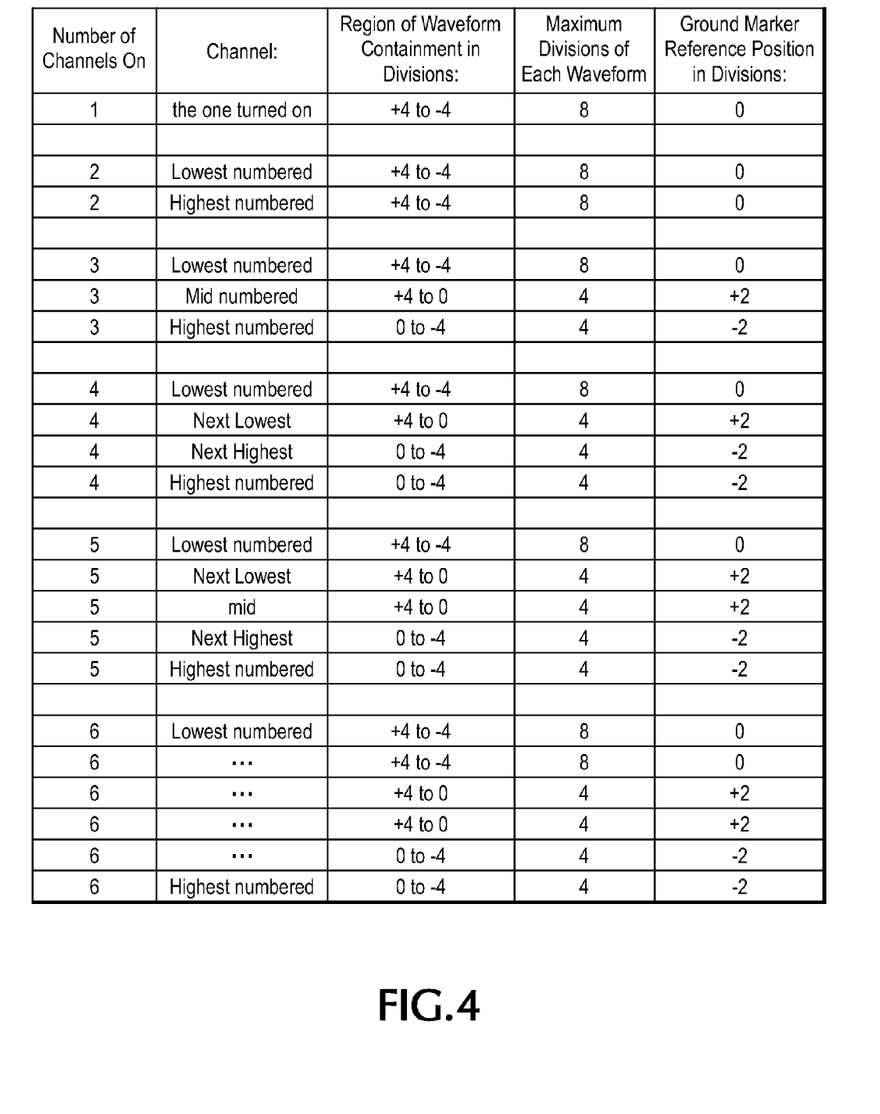
FIG. 4 is a Table defining vertical heights and ground marker positions to provide waveform overlap according to one embodiment of the present invention.

Each displayed waveform may be mapped into "waveform 1", which increases the number of possible displayable choices. The Table of FIG. 4 shows a possibility for each of a different number of channels displayed.

In another implementation, the user may specify a desired height in major divisions for all waveforms to be displayed. If only one waveform is displayed, the default choice is generally the entire display screen. If two waveforms are displayed, then the user may select a desired height of 8 through 4 divisions. If a height of 8 is selected, then each waveform shares the entire screen. If a height of 6 is selected, both waveforms use up to 6 divisions, where the lower numbered waveform has its ground marker centered at +1 division and the other waveform has its ground marker centered at −1 division. If a height of 4 is selected, the lower number waveform may use the top half of the screen while the other waveform may use the bottom half.

If three waveforms are selected, a height selection of 6 may center the three waveforms at +1, 0 and −1 divisions respectively. In general, the user selects a uniform waveform height in divisions, while the display processor staggers the displayed waveforms vertically, placing the ground markers at convenient divisions.

Figure 5:
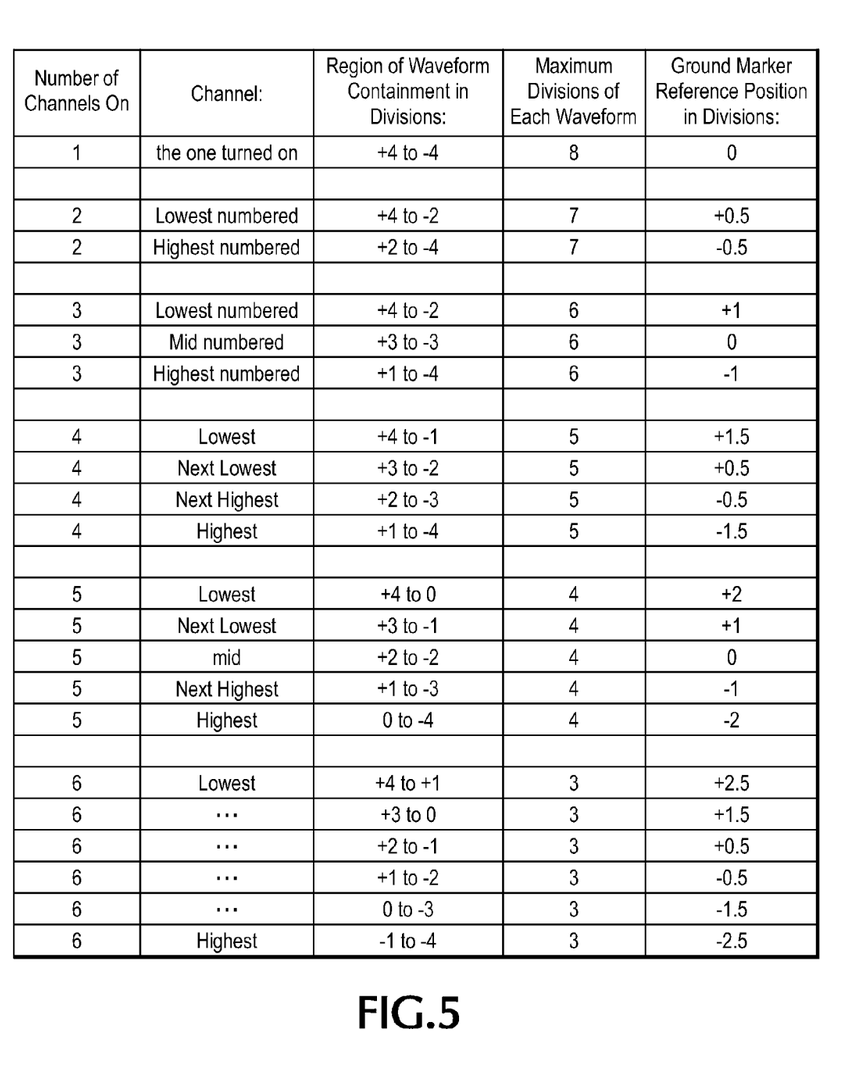
FIG. 5 is a Table defining vertical heights and ground marker positions to provide waveform overlap according to another embodiment of the present invention.
Figure 6:
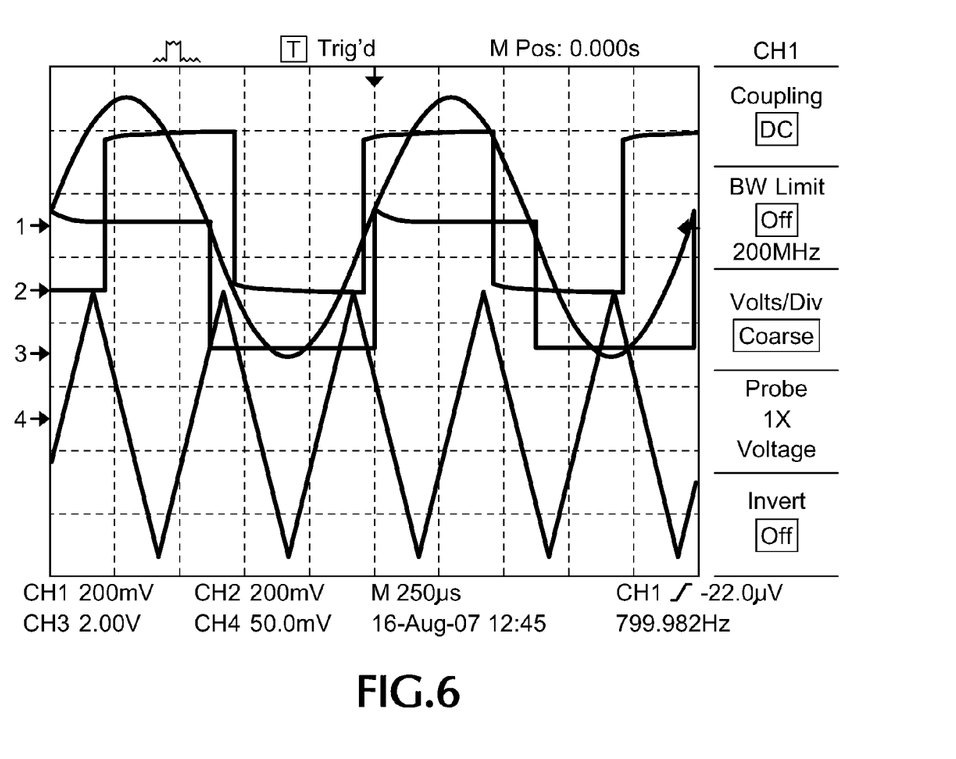
FIG. 6 is a plan view of a display screen view of multiple overlapping waveforms according to an embodiment of the present invention.

A simplification of the overlap function may give the user only two overlap choices—"none" or "all". An overlap table for "all" may be defined as shown in FIG. 5. In any event the result is a display that provides overlapping waveforms on the display screen, each waveform having a defined height in divisions, such that the four waveforms shown in FIG. 2 are overlapped as shown in FIG. 6.

Further, the user may be given the option of not only inputting the desired vertical height for each waveform, but also the position of the ground marker. In this way the user has complete flexibility in setting up the overlap display of multiple acquired waveforms.

Thus, the present invention provides a region overlap control for multiple waveforms displayed on the screen of a measurement instrument by assigning a height to each waveform according to an overlap selection and adjusting a ground marker accordingly.

Figure 7:
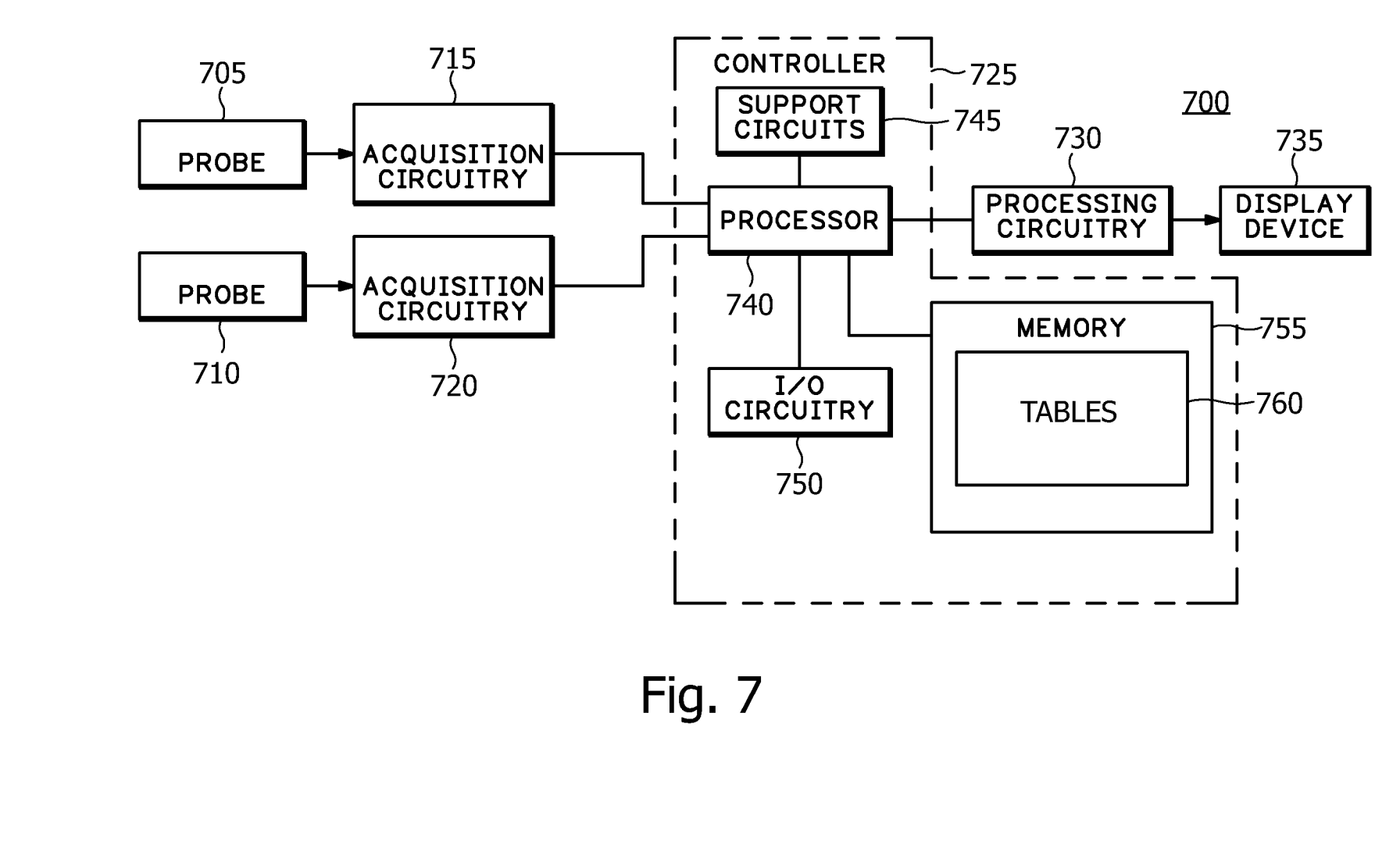
FIG. 7 is a simplified block diagram of an oscilloscope according to the subject invention.

FIG. 7 depicts a high level block diagram of an oscilloscope 700 having the overlapping waveform displays of the present invention. In particular, the exemplary oscilloscope 700 of the present invention utilizes a probe 705 and a probe 710, and comprises respective acquisition circuitry 715, 720, a controller 725, processing circuitry 730, and a display device 735. Probes 705 and 710 may be any conventional probes suitable for detecting signals from a device under test device (not shown). Only 2 probes have been shown for simplicity, but oscilloscopes having 4 probes are commonly known. Probes 705 and 710 may be provided by Tektronix, Inc., such as active probe model number P5205, among others, which may be used to acquire real time signal information. However, one skilled in the art will appreciate that other conventional voltage and current probes may also be utilized to detect voltage and current signals from a particular element in a circuit. The output of the probes 705 and 710 are respectively sent to the respective acquisition circuitry 715, 720.

Acquisition circuitry 715, 720 each comprise analog-to-digital conversion circuitry, triggering circuitry, decimator circuitry, supporting acquisition memory, and the like. Acquisition circuitry 715, 720 operate to digitize, at a sample rate, "S", one or more of the signals under test to produce one or more respective acquired sample streams suitable for use by controller 725 and/or processing circuitry 730. Acquisition circuitry 715, 720, in response to commands received from controller 725, change trigger conditions, decimator functions, and other acquisition related parameters. The acquisition circuitry communicates the resulting sample stream (SS) to controller 725.

Controller 725 operates to process the one or more acquired sample streams provided by acquisition circuitry 715 and 720 to generate respective waveform data associated with one or more sample streams. That is, given desired time per division and volts per division display parameters, controller 725 operates to modify or rasterize the raw data associated with an acquired sample stream to produce corresponding waveform data having the desired time per division and volts per division parameters. Controller 725 may also normalize waveform data having non-desired time per division, volts per division, and current per division parameters to produce waveform data having the desired parameters. Controller 725 provides the waveform data to the processing circuitry 730 for subsequent presentation on display device 735.

Processing circuitry 730 comprises data processing circuitry suitable for converting acquired sample streams or waveform data into image or video signals, which are adapted to provide visual imagery (e.g., video frame memory, display formatting and driver circuitry, and the like). Processing circuitry 730 may include the display device 735 (e.g., built-in display device) and/or provide output signals (e.g., via a video driver circuit) suitable for use by an external display device 735.

Processing circuitry 730 is optionally responsive to controller 735 and the various parameters, such as vertical (e.g., volts per division) and horizontal (e.g., time per division) display parameters, as well as user interface imagery (e.g., user prompts, diagnostic information and the like).

Controller 725 of FIG. 7 (enclosed within a dotted box) comprises a processor 740, support circuits 745, I/O circuitry 750 and memory 755. Processor 740 cooperates with conventional support circuitry 745, such as power supplies, clock circuits, cache memory, and the like, as well as circuits that assist in executing software routines stored in memory 755. As such, it is contemplated that some of the process steps discussed herein as software processes may be implemented within hardware, for example, as circuitry that cooperates with processor 740 to perform various steps. Controller 725 also contains input/output (I/O) circuitry 750 that forms an interface between the various function elements communicating with controller 725. For example, I/O circuitry 750 may comprise a keypad, pointing device, touch screen, or other user controllable input device adapted to provide user input and output to the controller 725. Controller 725, in response to such user input, adapts the operations of the acquisition circuitry 715, 720 to perform various data acquisitions, triggering, processing, display communications, among other functions. In addition, the user input may be used to trigger automatic calibration functions and/or adapt other operating parameters of display device 735, logical analysis, or other data acquisition devices.

Memory 755 may include volatile memory, such as SRAM, DRAM, among other volatile memories. Memory 755 may also include non-volatile memory devices, such as a disk drive or a tape medium, among others, or programmable memory, such as an EPROM, among others. Memory 755 stores the tables 760 of FIGS. 1, 4, and 5, for use by controller 725.

Although Controller 725 is depicted as a general purpose computer that is programmed to perform various control functions in accordance with the present invention, the invention may be implemented in hardware such as, for example, an application specific integrated circuit (ASIC). As such, it is intended that the processor described herein be broadly interpreted as being equivalently performed by hardware, software, or a combination thereof.

The word "or" is used herein in its inclusive sense, meaning "one, or the other, or both", and includes, but is not limited to, the meaning of a choice between alternatives wherein all of the alternatives must be present.

What is claimed is:

1. A method for use in a test and measurement instrument for displaying on a display screen multiple waveforms stored in a memory using a controller, comprising the steps of:
   receiving said multiple waveforms via a respective plurality of channels of an acquisition system of said test and measurement instrument;
   storing said waveforms in said memory;
   selecting from a menu of overlap options including none, any one of multiple waveforms, or all waveforms;
   assigning a larger vertical height than a previously displayed vertical height for each of the waveforms for the selected overlap option;
   adjusting a ground marker for each of the waveforms in accordance with the assigned vertical height and the selected overlap option
   displaying said multiple waveforms on said display screen of said test and measurement instrument wherein a portion of one waveform of said multiple waveforms overlaps a portion of another of said waveforms of said multiple waveforms; and
   using said larger vertical height of a selected waveform to enhance triggering performance of said test and measurement instrument, wherein
   substantially all of said overlapped waveform of said multiple waveforms is viewable on said display screen, and wherein
   the selecting step comprises selecting the overlap option from a group consisting of "none", "small overlap", and "large overlap".

2. The method as recited in claim 1 wherein the assigning step for at least three waveforms comprises the step of assigning each of the waveforms to a display region selected from the group consisting of the entire display screen and a specified vertical half of the display screen.

3. The method as recited in claim 2 wherein the adjusting step comprises the step of automatically adjusting the ground marker for each waveform as a function of the separate vertical heights.

4. The method as recited in claim 2 wherein the adjusting step comprises the step of the user specifying the ground marker for each of the waveforms to provide a desired overlap between the waveforms being displayed.

5. The method as recited in claim 4 wherein the adjusting step comprises the step of automatically adjusting the ground marker for each waveform as a function of the number of waveforms being displayed.

6. The method as recited in claim 1 wherein the assigning step for at least two waveforms comprises the step of a user specifying a separate vertical height for each of the waveforms being displayed.

7. The method as recited in claim 1 wherein the assigning step comprises the step of automatically assigning an equal vertical height to each of the waveforms as a function of the number of waveforms being displayed.

8. A test and measurement instrument, comprising:
   an acquisition system, said acquisition system including a plurality of input channels for simultaneously acquiring multiple waveforms, respectively;
   user operable selector, said selector selecting an overlap option from a menu in response to user input, said overlap options including none, any one of multiple waveforms, or all waveforms;
   a memory for storing a plurality of waveforms;
   a controller assigning a larger vertical height than a previously displayed vertical height for each of the plurality of waveforms for the selected overlap option;
   said controller adjusting a ground marker for each of said waveforms in accordance with the assigned vertical height and the selected overlap option;
   said controller causing a display of said waveforms on a display screen in accordance with the assigned vertical height and the selected overlap option; and
   a display screen, said display screen displaying each of said plurality of waveforms wherein;
   said selected overlap option causes a portion of one waveform of said plurality of waveforms to overlap a portion of another of said waveforms of said plurality of waveforms, wherein
   substantially all of said overlapped waveform of said plurality of waveforms is viewable on said display screen, wherein
   said controller uses said larger vertical height of a selected waveform to enhance triggering performance of said test and measurement instrument, and wherein
   said selector has selections including "none", "small overlap", and "large overlap".

9. The test and measurement instrument as recited in claim 8 wherein said controller assigns each of said waveforms to a first display region comprising substantially all of said display screen or to a second display region comprising a specified vertical half of the display screen.

10. The test and measurement instrument as recited in claim 9 wherein said controller automatically adjusts the ground marker for each waveform as a function of predetermined respective vertical heights.

11. The test and measurement instrument as recited in claim 9 wherein said user operable selector includes selections allowing a user to specify the ground marker position for each of the waveforms to provide a desired overlap between the waveforms being displayed.

12. The test and measurement instrument as recited in claim 11 wherein said controller automatically adjusts the ground marker for each waveform as a function of the number of waveforms being displayed.

13. The test and measurement instrument as recited in claim 8 wherein said user operable selector includes selections allowing a user to specify a separate vertical height for each of the waveforms being displayed.

14. The test and measurement instrument as recited in claim 8 wherein said controller automatically assigns an equal overlapping vertical height to each of the waveforms as a function of the number of waveforms being displayed.

* * * * *